(12) United States Patent
Ohkubo

(10) Patent No.: US 6,821,009 B2
(45) Date of Patent: Nov. 23, 2004

(54) LIGHT SOURCE DEVICE

(75) Inventor: Kazunobu Ohkubo, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/160,031

(22) Filed: Jun. 4, 2002

(65) Prior Publication Data

US 2002/0185968 A1 Dec. 12, 2002

(30) Foreign Application Priority Data

Jun. 7, 2001 (JP) .......................... 2001-172270

(51) Int. Cl.[7] ............... H01J 1/62; F21V 7/04
(52) U.S. Cl. ............ 362/554; 313/506; 313/492; 313/504; 385/115
(58) Field of Search ............. 362/554; 385/115; 313/506, 504, 492; 428/690, 696

(56) References Cited

U.S. PATENT DOCUMENTS

| | | | |
|---|---|---|---|
| 5,753,381 A | * 5/1998 | Feldman et al. | 428/696 |
| 5,876,863 A | * 3/1999 | Feldman et al. | 428/690 |
| 6,469,438 B2 | * 10/2002 | Fukuoka et al. | 313/504 |
| 6,538,375 B1 | * 3/2003 | Duggal et al. | 313/506 |
| 6,542,676 B2 | * 4/2003 | Olbricht et al. | 385/115 |
| 2002/0008463 A1 | * 1/2002 | Roach | 313/492 |

FOREIGN PATENT DOCUMENTS

JP          08-315984          11/1996

* cited by examiner

Primary Examiner—Stephen Husar
Assistant Examiner—James W Cranson
(74) Attorney, Agent, or Firm—Sughrue Mion, PLLC

(57) ABSTRACT

A light source device is provided which can output a plurality of lights by using a plurality of light transmitting media, and which can supply light of a sufficient intensity to the respective light transmitting media. An organic EL element, which is formed by successively layering a transparent electrode layer serving as an anode, an organic compound layer including a light-emitting layer, and a metal electrode layer serving as a cathode, is provided on the side surface of a fiber which propagates, in an axial direction, light from the organic EL element which has been introduced into an interior of the fiber. A plurality of the fibers are arranged in an array form and fixed by a conductive binder, and then sandwiched between two common electrode plates. Common voltage can be applied collectively to the organic EL elements of the plural fibers. Further, a transparent electrode exposed portion is provided at a light input side end portion of each fiber. An anode voltage can be applied independently to each of the organic EL elements of the plural fibers.

28 Claims, 4 Drawing Sheets

18: METAL ELECTRODE LAYER
16: ORGANIC COMPOUND LAYER          20: ORGANIC EL ELEMENT
14: TRANSMISSION ELECTRODE LAYER
12: FIBER
22: CONDUCTIVE BINDER
24: ELECTRODE PLATE

30: REFLECTING FILM

LIGHT SOURCE DEVICE

BACKGROUND OF THE INVENTION

1. Field of the Invention

The present invention relates to a light source device, and in particular, to a light source device in which light-emitting elements are provided on the side surfaces of light transmitting media, and the lights from the light-emitting elements are introduced from the side surfaces of the light transmitting media to the interiors thereof, and are outputted from end portions of the light transmitting media.

2. Description of the Related Art

In conventional optical communication systems, a technique has been used which transmits and outputs, by a light transmitting medium such as an optical fiber or the like, light which is emitted from a light-emitting element. Specifically, an LD (laser diode) is generally used as the light-emitting element, and the light outputted from the LD is incident on the end surface of the optical fiber and is introduced into the interior of the optical fiber.

The optical fiber is a long, thin, fiber-shaped body having a small diameter. Thus, a structure in which a plurality of optical fibers are used and the light output sides thereof are bundled together is applied to light sources requiring output of plural lights at a high density, e.g., illumination, exposure light sources for printers, light-emitting light sources for displays, and the like. However, when light enters from the end surface of the optical fiber, because the light-emitting surface area at the optical fiber side end surface of the LD is small, there are limits to the amount of light which is introduced into the optical fiber. Accordingly, the amount of light outputted from the optical fiber is also small. Thus, application to various uses such as illumination, exposure light sources of printers, light-emitting light sources of displays, and the like, is difficult.

Thus, as disclosed in Japanese Patent Application Laid-Open (JP-A) No. 8-315984, a technique has been studied which utilizes, as a light-emitting element, an electric field light-emitting element called an electroluminescent (hereinafter, "EL") element which uses, in the light-emitting layer thereof, an inorganic or organic substance which emits light by voltage being applied. EL elements can be broadly classified into inorganic EL elements and organic EL elements, in accordance with the material used in the light-emitting layer. Among these, organic EL elements have the features that they are easier to manufacture than other light-emitting elements, thin and light-weight light-emitting elements can be formed, and organic EL elements can be driven at a lower voltage than inorganic EL elements. Thus, much attention is being paid to organic EL elements in particular. In JP-A No. 8-315984 as well, by using an organic EL element (more specifically, by providing an organic EL element so as to be wound on the periphery of a rod-like base member such as an optical fiber or the like), the surface area of light emission of the organic EL element with respect to the base material can be made large, and a larger amount of light can be introduced into the base member.

However, in the technique disclosed in JP-A No. 8-315984, because only a single optical fiber is used, only a single light is outputted, and the technique can only be used for limited applications.

SUMMARY OF THE INVENTION

The present invention was developed in order to overcome the above-described problems, and an object of the present invention is to provide a light source device which can output a plurality of lights by using light transmitting media, and which can supply light of a sufficient intensity to the respective light transmitting media.

In order to achieve the above object, a light source device of a first aspect of the present invention comprises: media for transmitting light that has been introduced into interiors of the media and outputting the light from ends of the media, the ends being disposed in a predetermined arrangement; light-emitting elements, each being disposed at at least a portion of a side surface of a respective one of the media, and each element comprising a transparent first electrode layer serving as an anode, a layer emitting light upon application of a voltage thereto, and a second electrode layer serving as a cathode, being layered successively; and a portion for applying voltage between the first electrode layer and the second electrode layer of each of the light-emitting elements.

In accordance with the first aspect of the present invention, each light-emitting element emits light when voltage is applied by the voltage applying section. The emitted light passes through the transparent first electrode layer, and is introduced into the interior of the light transmitting medium from the side surface of that light transmitting medium. Thus, light of a sufficient intensity can be provided to the light transmitting medium, as compared with a type of light transmitting medium in which light is incident onto the end surface thereof (hereinafter, "end surface incident type light transmitting medium"). Note that the intensity of the light which is introduced into the interior of the light transmitting medium can be adjusted by adjusting the surface area of the light-emitting element on the side surface of the light transmitting medium.

The light transmitting medium transmits the light introduced therein, and outputs the light from the end surface thereof. At this time, the respective end portions of plural light transmitting media may be disposed in a predetermined arrangement such that the plural lights can be outputted from the light source device on the basis of this arrangement. In this way, plural lights can be outputted by using plural light transmitting media, and light of a sufficient intensity can be supplied to the respective light transmitting media. Thus, the light source device can be utilized in more applications than the conventional art.

In a light source device of a second aspect of the present invention, in the first aspect, the predetermined arrangement is one-dimensional or two-dimensional. In accordance with the second aspect, a plurality of lights which are disposed in a one-dimensional arrangement or in a two-dimensional arrangement can be outputted from the light source device. Namely, the light source device can be used as the light source of all types of apparatuses which require a plurality of lights in a one-dimensional arrangement or a two-dimensional arrangement.

In a light source device of a third aspect of the present invention, in the first or second aspect, the elements are a combination of plural types of light-emitting elements outputting lights of different wavelengths. In accordance with the third aspect, lights of plural wavelengths can be outputted in a predetermined arrangement (pattern) from the light source device. The light source device can be used as the light source of all types of apparatuses which require, for example, lights of wavelengths corresponding to red color, green color, blue color, and the like.

In a light source device of a fourth aspect of the present invention, in any of the first through third aspects, the voltage applying portion applies voltage independently to each of the plurality of light-emitting elements. In accordance with the fourth aspect, the light outputs from the plurality of light transmitting media can be controlled independently. Thus, the degrees of freedom increase, and the range of utilization of the light source device can be broadened.

In a light source device of a fifth aspect of the present invention, in any of the first through fourth aspects, the light-emitting elements are organic electroluminescent elements. In the light source device of the fifth aspect, organic electroluminescent elements, which are easier to manufacture than other light-emitting elements, are used as the light-emitting elements. Thus, the light source device can be made to be thin and light-weight, and driving at a low voltage is possible.

DETAILED DESCRIPTION OF THE PREFERRED EMBODIMENTS

Figure 1A:
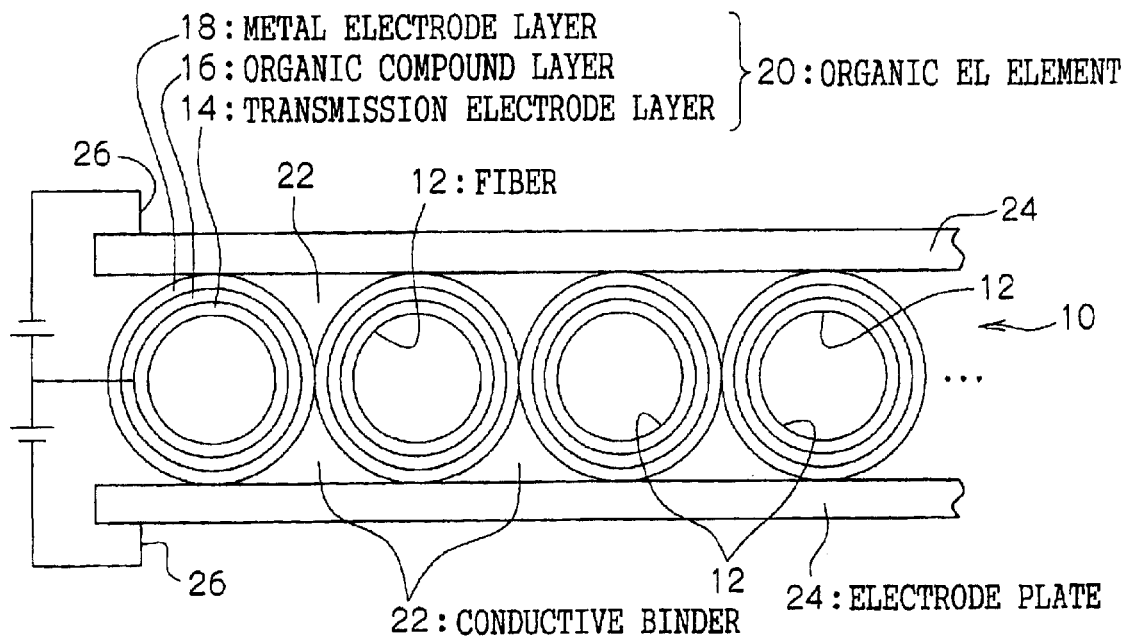
FIG. 1A is a cross-sectional view showing a structure of a light source device relating to an embodiment of the present invention.
Figure 1B:
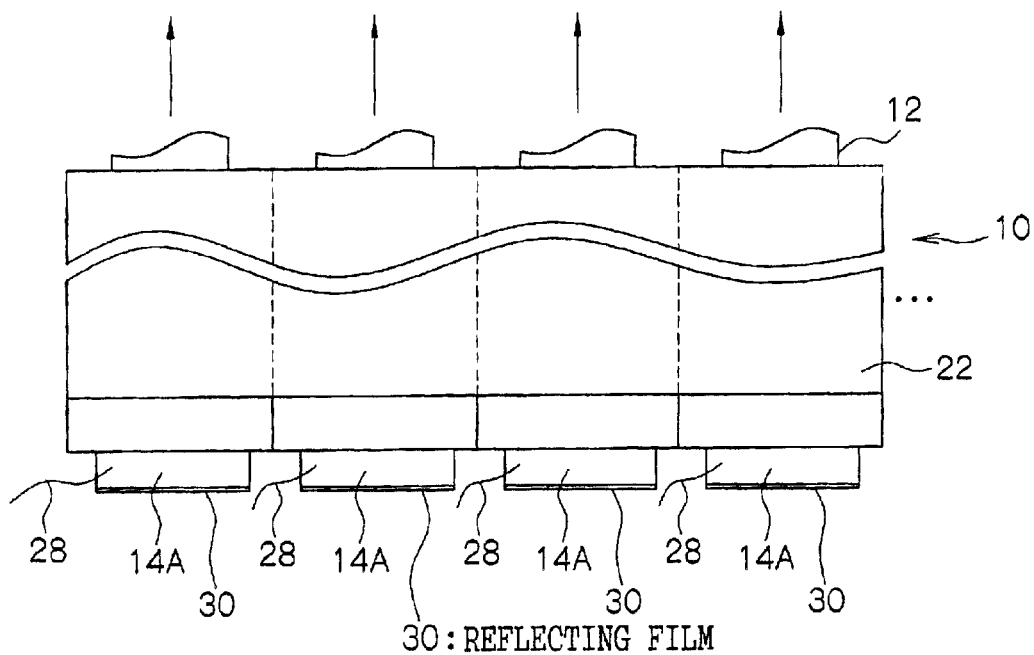
FIG. 1B is a top view showing the structure of the light source device relating to the embodiment of the present invention.

Next, an example of an embodiment relating to the present invention will be described in detail with reference to the drawings. FIGS. 1A and 1B show a light source device to which the present invention is applied.

As shown in FIGS. 1A and 1B, a light source 10 is equipped with a plurality of fibers 12 as light transmitting media. An organic EL element 20 serving as a light-emitting element is provided at the side surface of one end (hereinafter called the "light input side") of each fiber 12. The organic EL element 20 is formed by successively layering a transparent electrode layer 14 serving as an anode, an organic compound layer 16 including a light-emitting layer, and a metal electrode layer 18 serving as a cathode.

Note that the fiber 12 is merely an example. The configuration of the light transmitting medium is not limited to rod-shaped, cylindrical, fiber-shaped, or the like which is suggested thereby, and the light transmitting medium may be any configuration. Further, in the present embodiment, the organic EL element is described as an example, but an inorganic EL element may be used in place of the organic EL element.

When voltage is applied between the transparent electrode layer 14 and the metal electrode layer 18 of the organic EL element 20, the light-emitting layer of the organic compound layer 16 emits light. The emitted light passes through the inner side of the organic EL element 20, i.e., through the transparent electrode layer 14, and is introduced into the interior of the fiber 12 from the side surface thereof. Note that the light which proceeds directly toward the outer side, i.e., toward the metal electrode layer 18, is reflected by the metal electrode layer 18 and made into light which proceeds directly toward the inner side. This light similarly passes through the transparent electrode layer 14, and is introduced to the interior of the fiber 12 from the side surface thereof.

A plurality of the fibers 12, at whose side surfaces the organic El elements 20 are formed, are bundled together in a state of being arranged in an array form (one-dimensionally), and are fixed by a conductive binder 22. The plurality of fibers 12 in this state are then sandwiched between two electrode plates 24 which serve as common electrodes. A lead wire 26, which is for applying negative voltage, is connected to each electrode plate 24. The lead wires 26 can apply common voltage collectively to all of the organic EL elements 20 provided at the side surfaces of the plurality of fibers 12.

At the distal end of the light input side of each fiber 12, the transparent electrode layer 14 is exposed such that a transparent electrode exposed portion 14A (see FIG. 1B) is formed thereat. The transparent electrode exposed portion 14A is an anode voltage of the organic EL element 20. A lead wire 28, which is connected to a driver (not shown) and which is for applying positive voltage from the driver, is connected to the transparent electrode exposed portion 14A. Anode voltage can thereby be applied independently to each of the organic EL elements 20 provided at the plural fibers 12. Namely, each of the organic EL elements 20 can be subjected to lighting control independently. Note that the electrode plates 24 and the lead wires 28 correspond to the voltage applying section.

Next, the respective structural elements will be described in detail.

The fiber 12 propagates, in the axial direction thereof, the light which has been introduced into the interior thereof. For example, an optical fiber formed of quartz glass can be used as the fiber 12. Further, a reflecting film 30 is vapor deposited on the end surface of the light input side of the fiber 12. Among the light introduced into the fiber 12 from the organic EL element 20, the light which advances toward the end surface of the light input side is reflected by the reflecting film 30, and is made into light which advances toward the end surface of the reflecting side (which will be called the "light outputting side" hereinafter). Namely, at the fiber 12, the light which is introduced into the fiber 12 from the organic EL element 20 propagates toward the end surface at the light outputting side, and is outputted from the end surface at the light outputting side.

In the wavelength region of visible light of 400 nm to 700 nm, the transparent electrode layer 14 has a light transmittance of at least 50% or more, and preferably 70% or more. Examples of materials for forming the transparent electrode layer 14 are compounds known as transparent electrode materials such as tin oxide, indium-tin oxide (ITO), indium-zinc oxide, and the like. In addition, a thin film of a metal having a high work function such as gold or platinum or the like may be used as the material for the transparent electrode layer 14. Or, an organic compound such as polyaniline, polythiophene, polypyrrole, derivatives thereof, or the like, may be used as the material for the transparent electrode layer 14. Transparent electrode films are disclosed in detail in *New Developments in Transparent Electrode Films* (*Tomei Doudenmaku no Shintenkai*), Yutaka Sawada (chief editor), published by CMC, 1999, and can be applied to the present invention. Further, the transparent electrode layer 14 may be formed by any of known methods such as a vacuum deposition method, a sputtering method, an ion plating method, or the like, while rotating the fiber 12 by using its axis as the axis of rotation.

The organic compound layer 16 may be a single layer structure formed from only a light-emitting layer, or may be a layered structure having, in addition to the light-emitting layer and as needed, other layers such as a hole injecting layer, a hole transporting layer, an electron injecting layer, an electron transporting layer, or the like. Examples of specific structures of the organic compound layer 16 (listed hereinafter so as to include the electrodes as well) are anode/hole injecting layer/hole transporting layer/light-emitting layer/electron transporting layer/cathode, anode/light-emitting layer/electron transporting layer/cathode, anode/hole transporting layer/light-emitting layer/electron transporting layer/cathode, and the like. Further, a plurality of each of the light-emitting layer, the hole transporting layer, the hole injecting layer, and the electron injecting layer may be provided.

The organic compound layer of the present embodiment is the same as an organic compound layer of a conventionally-known organic EL element. For the structural materials, the methods for forming, and the layer thickness of the respective layers forming the organic compound layer, those of the conventional art can be applied appropriately.

The metal electrode layer 18 is preferably formed from a metal material such as an alkali metal having a low work function such as Li, K or the like, an alkali earth metal having a low work function such as Mg, Ca or the like, alloys and mixtures of these metals and Ag, Al or the like. In order to achieve both storage stability and electron injectability at the cathode, electrodes formed of the above materials may be covered by Ag, Al, Au or the like which has a high work function and good conductivity. Note that, in the same way as the transparent electrode layer 14, the metal electrode layer 18 may be formed by a known method such as a vacuum deposition method, a sputtering method, an ion plating method, or the like.

In this way, in the present embodiment, a plurality of fibers 12, each of which has, at the side surface thereof, an organic EL element 20 and each of which propagates, in the axial direction thereof, light from the organic EL element 20 which has been introduced into the interior thereof, are arranged in an array form and fixed by a conductive binder 22, and are then sandwiched between the two common electrode plates 24. Accordingly, common voltage can be applied collectively to the organic EL elements 20 of the plurality of fibers 12. Moreover, the transparent electrode exposed portion 14A is provided at the end portion at the light input side of each fiber 12, and an anode voltage can be applied independently to each of the organic EL elements 20 of the plural fibers 12.

In this way, the light from the organic EL element 20 provided at the side surface of each of the plurality of fibers 12 can be introduced from the side surface of the fiber 12 into the interior thereof. Thus, the amount of light that can be introduced into the interior of the fiber 12 is greater than that in a conventional end surface incident type light transmitting medium. Moreover, the light which is introduced into the fiber 12 is outputted from the end surface at the light outputting side of that fiber 12. A plurality of lights, which are in a state of being aligned one-dimensionally, can be obtained, and can be used as a so-called array light source. Thus, the light source device 10 can be used in many applications. Moreover, because each of the organic EL elements 20 can be controlled independently by a driver or the like, the light source device 10 can be applied to an even wider range of applications.

Note that the amount of outputted light depends on the surface area over which the organic EL element 20 contacts the side surface of the fiber 12. Thus, the amount of outputted light can be adjusted in accordance with the application by adjusting the width of the organic EL element 20 (i.e., the length of the organic EL element 20 along the axial direction of the fiber 12).

Moreover, it is possible to use only one type of organic EL element 20 which outputs light of the same wavelength, or a plurality of types of organic EL elements 20 which output lights of different wavelengths may be combined. Further, description is given above of a case which is an example in which the plurality of fibers 12 are arranged in an array form. However, the present invention is not limited to the same.

Figure 2:
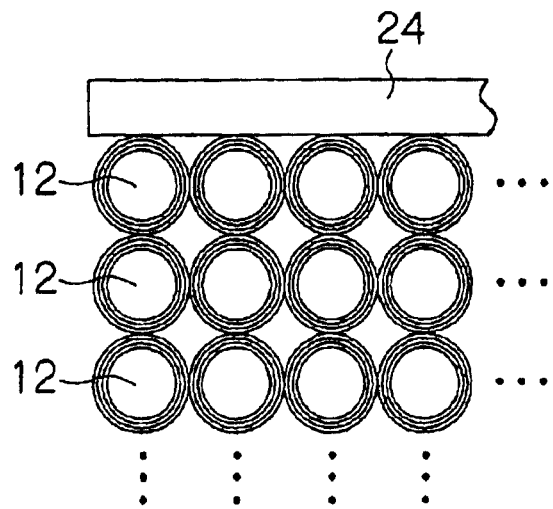
FIG. 2 is a diagram showing an example of a two-dimensional arrangement of a plurality of fibers 12 used in the light source device of the present invention.
Figure 3:
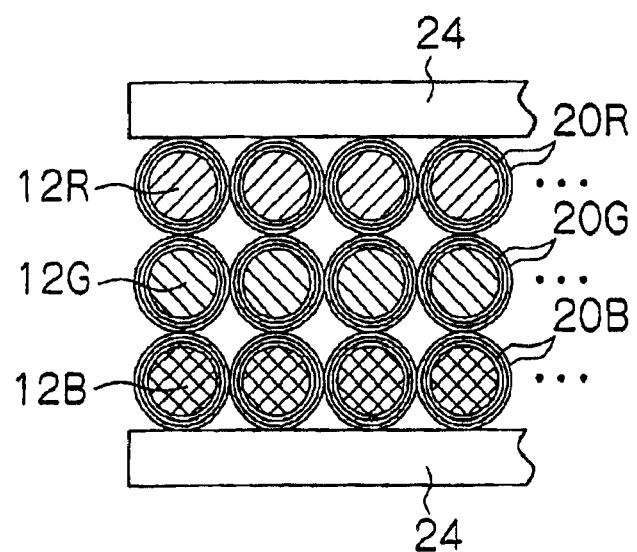
FIG. 3 is a diagram showing an example of a three-row arrangement of the plurality of fibers 12 used in the light source device of the present invention.

For example, the plurality of fibers 12 may be arranged in a two-dimensional arrangement as shown in FIG. 2. Or, as shown in FIG. 3, a three-row arrangement is possible in which fibers 12R, fibers 12G, and fibers 12B are, respectively, arranged in an array (in one row). The fibers 12R have, on the side surfaces thereof, organic EL elements 20R which output light of a wavelength corresponding to red color. The fibers 12G have, on the side surfaces thereof, organic EL elements 20G which output light of a wavelength corresponding to green color. The fibers 12B have, on the side surfaces thereof, organic EL elements 20B which output light of a wavelength corresponding to blue color. This case in particular can be used as the exposure light source for a color printer because light of a wavelength corresponding to red color, light of a wavelength corresponding to green color, and light of a wavelength corresponding to blue color are lined up and outputted in three rows.

Figure 4:
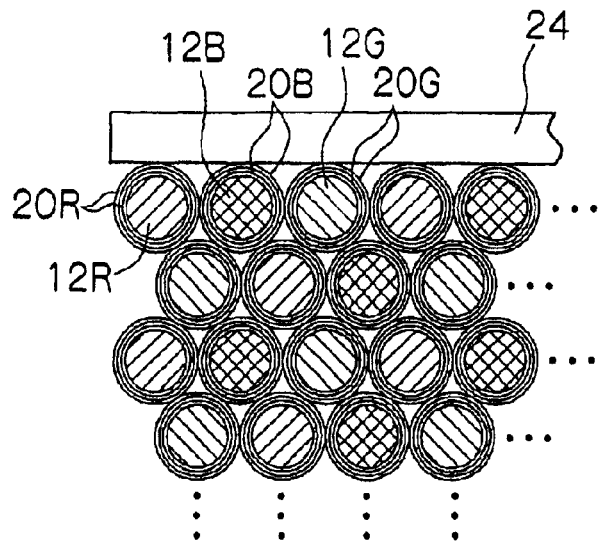
FIG. 4 is a diagram showing an example of a delta arrangement of the plurality of fibers 12 used in the light source device of the present invention.
Figure 5:
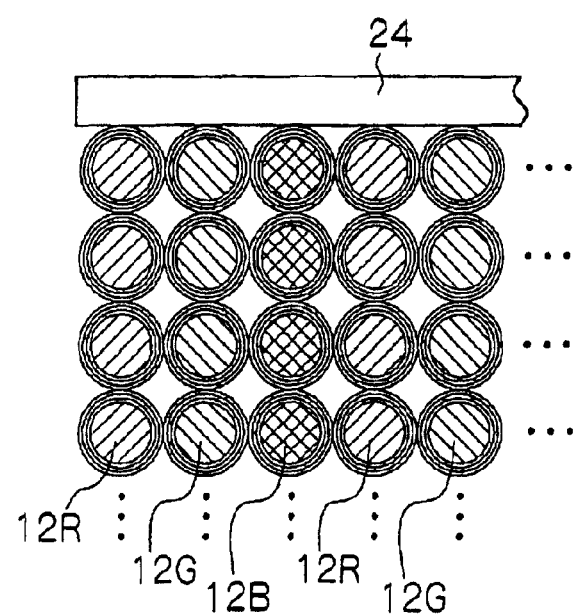
FIG. 5 is a diagram showing an example of a striped arrangement of the plurality of fibers 12 used in the light source device of the present invention.

The light source device 10 can be used as the light-emitting light source of a display by arranging the fibers 12R, the fibers 12G and the fibers 12B in a so-called delta arrangement as shown in FIG. 4, or by arranging the fibers 12R, the fibers 12G and the fibers 12B in a so-called striped arrangement as shown in FIG. 5.

Figure 6:
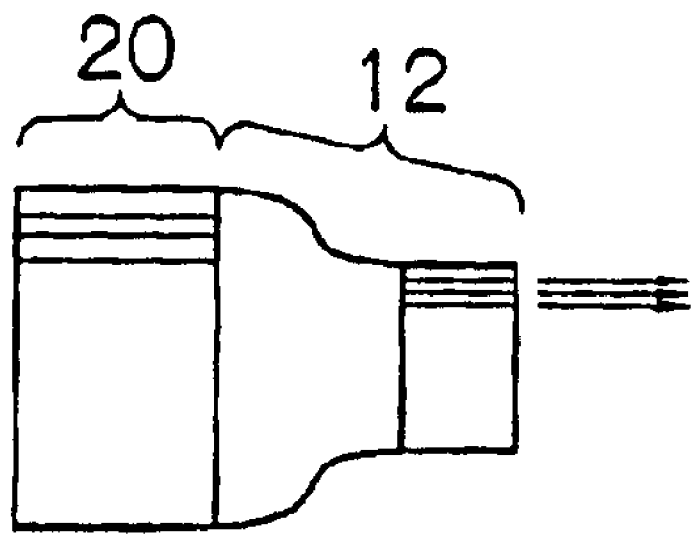
FIG. 6 is a diagram showing an example of another way of bundling the plurality of fibers 12 used in the light source device of the present invention.

The overall diameter of the light input side end portion is greater than that of the light outputting side end portion, by an amount corresponding to the organic EL element 20. Thus, even if the light input side end portions of the plural fibers 12 are aligned in a state in which the intervals therebetween are made as small as possible, there is still leeway in the intervals between the fibers at the light outputting sides thereof. Thus, as shown in FIG. 6, the fiber 12 may be a flexible fiber, and the light outputting side end portions of the fibers 12 can be bundled separately from the light input side end portions at which the organic EL elements 20 are provided. In this way, the lights outputted from the respective fibers 12 can be made to be even more dense. Namely, plural lights can be outputted from the light source device 10 at an even higher density.

What is claimed is:

1. A light source device comprising:
   media for transmitting light that has been introduced into interiors of the media and outputting the light from ends of the media, the ends being disposed in a predetermined arrangement;

light-emitting elements, each being disposed formed at at least a portion of a side surface of a respective one of the media, and each element comprising a transparent first electrode layer serving as an anode, a layer emitting light upon application of a voltage thereto, and a second electrode layer serving as a cathode, being layered successively; and a portion for applying voltage between the first electrode layer and the second electrode layer of each of the light-emitting elements.

2. The light source device of claim 1, wherein the predetermined arrangement is one-dimensional.

3. The light source device of claim 1, wherein the predetermined arrangement is two-dimensional.

4. The light source device of claim 1, wherein the elements are a combination of plural types of light-emitting elements outputting lights of different wavelengths.

5. The light source device of claim 2, wherein the plurality of light-emitting elements are a combination of plural types of light-emitting elements outputting lights of different wavelengths.

6. The light source device of claim 3, wherein the plurality of light-emitting elements are a combination of plural types of light-emitting elements outputting lights of different wavelengths.

7. The light source device of claim 3, wherein the plurality of light-emitting elements are plural types of light-emitting elements outputting lights of different wavelengths, and the light-emitting elements of each one type of the plural types are arranged in one row in one dimension, and respective one rows are disposed adjacent to each other in another one dimension.

8. The light source device of claim 3, wherein the plurality of light-emitting elements respectively output light of different wavelengths, and the light-emitting elements outputting the light of respectively different wavelengths are arranged in one row in one direction in one dimension and the one row is disposed adjacent to another row in another direction in the same dimension.

9. The light source device of claim 8, wherein the one direction and the another direction are orthogonal to one another in the same dimension.

10. The light source device of claim 1, wherein the voltage applying portion applies voltage independently to each of the light-emitting elements.

11. The light source device of claim 1, wherein the elements are organic electroluminescent elements.

12. The light source device of claim 1, wherein the media are optical fibers.

13. The light source device according to claim 1, wherein each of the media is a cylindrical optical fiber, and the first electrode layer, the light-emitting layer, and the second electrode layer are layered so as to be wound around the optical fiber.

14. The light source according to claim 12, wherein the optical fibers are coupled together by a conductive binder.

15. The light source device of claim 12, wherein the optical fiber propagates light in the axial direction thereof.

16. The light source according to claim 1, wherein an electrode plate is coupled to the second electrode of said light-emitting elements, the electrode plate forming a common electrode for said light-emitting elements.

17. A light source device comprising:

a plurality of optical fibers operable to output light from an end thereof; and a plurality of electroluminescent elements, each electroluminescent element being coupled to a respective one of said plurality of optical fibers, wherein each of said electroluminescent elements comprises a transparent first electrode layer serving as an anode, a light emitting layer, and a second electrode layer serving as a cathode, wherein, when a voltage is applied across said first electrode layer and said second electrode layer of one of said electroluminescent elements, said light emitting layer emits light toward the respective one of said plurality of optical fibers.

18. The light source according to claim 17, wherein the light which is emitted from the light emitting layer is input to a side surface of said optical fiber.

19. The light source device of claim 18, wherein the light input to said optical fiber propagates in an axial direction of said optical fiber toward an end surface thereof.

20. The light source according to claim 17, wherein an electrode plate is coupled to the second electrode of said plurality of electroluminescent elements, the electrode plate forming a common electrode for said plurality of electroluminescent elements.

21. The light source according to claim 20, wherein said plurality of optical fibers are coupled together by a conductive binder.

22. A light source device comprising:

a plurality of optical mediums operable to output light from an end thereof, and a plurality of electroluminescent elements, each electroluminescent element being coupled to a respective one of said plurality of optical mediums, wherein each of said electroluminescent elements comprises a transparent first electrode layer serving as an anode, a light emitting layer, and a second electrode layer serving as a cathode, wherein, when a voltage is applied across said first electrode layer and said second electrode layer of one of said electroluminescent elements, said light emitting layer emits light toward the respective one of said plurality of optical mediums.

23. The light source according to claim 22, wherein the light which is emitted from the light emitting layer is input to a side surface of said optical medium.

24. The light source device of claim 23, wherein the light input to said optical medium propagates in an axial direction of said optical medium toward an end surface thereof.

25. The light source according to claim 22, wherein an electrode plate is coupled to the second electrode of said plurality of electroluminescent elements, the electrode plate forming a common electrode for said plurality of electroluminescent elements.

26. The light source according to claim 25, wherein said plurality of optical mediums are coupled together by a conductive binder.

27. The light source device of claim 1, wherein the predetermined arrangement is configured to be used as the exposure light source for a color printer.

28. The light source device of claim 1, wherein the predetermined arrangement is configured to be used as the light source of a display.

* * * * *